United States Patent [19]
Krauter et al.

[11] Patent Number: 5,606,257
[45] Date of Patent: Feb. 25, 1997

[54] DEVICE FOR FORMING A SQUARE-WAVE SIGNAL AND DETECTING A REFERENCE MARK FROM A SINUSOIDAL SIGNAL WITH A SINGULARITY

[75] Inventors: Immanuel Krauter, Burgstetten; Davide Buro, Reutlingen, both of Germany

[73] Assignee: Robert Bosch GmbH, Stuttgart, Germany

[21] Appl. No.: 302,684

[22] PCT Filed: Feb. 4, 1994

[86] PCT No.: PCT/DE94/00108

§ 371 Date: Aug. 29, 1994

§ 102(e) Date: Aug. 29, 1994

[87] PCT Pub. No.: WO94/18754

PCT Pub. Date: Aug. 18, 1994

[30] Foreign Application Priority Data

Feb. 4, 1993 [DE] Germany .................. 43 03 209.5

[51] Int. Cl.⁶ .............. H03K 5/153; F02P 7/67; G01D 5/244; G01B 7/30
[52] U.S. Cl. .............. 324/207.25; 123/414; 324/166; 327/18; 327/79; 377/17
[58] Field of Search .................. 324/166, 207.12, 324/207.25; 123/146.5 A, 414, 617; 327/18, 79; 377/17

[56] References Cited

U.S. PATENT DOCUMENTS

| | | | |
|---|---|---|---|
| 3,767,938 | 10/1973 | Kueper | 327/79 X |
| 4,233,592 | 11/1980 | Leichle | 324/207.25 X |
| 4,262,251 | 4/1981 | Fujishiro et al. | 324/166 X |
| 4,797,827 | 1/1989 | Cockerham | 123/414 X |
| 5,430,370 | 7/1995 | Rooke | 324/207.25 X |
| 5,446,375 | 8/1995 | Perkins | 324/207.25 X |

FOREIGN PATENT DOCUMENTS

| | | |
|---|---|---|
| 0117789 | 9/1984 | European Pat. Off. . |
| 0366619 | 5/1990 | European Pat. Off. . |
| 2189987 | 1/1974 | France . |
| 3127220 | 1/1983 | Germany . |
| 2065310 | 6/1981 | Great Britain . |

*Primary Examiner*—Gerard R. Strecker
*Attorney, Agent, or Firm*—Michael J. Striker

[57] ABSTRACT

A device which reshapes sinusoidal signals with a singularity to generate square-wave signals and detects the singularity in an unambiguous and reliable manner. The sinusoidal pulses are reshaped into square-wave pulses in such a way that the edges of the square-wave pulses always occur at the same location regardless of the height of the sinusoidal signal. This is achieved in that a change in the edges of the square-wave signals is initiated whenever the sinusoidal signal crosses the zero-axis. The required signal processing and logical comparisons, which also enable a definite detection of reference marks, are carried out in a suitable circuit arrangement.

10 Claims, 3 Drawing Sheets

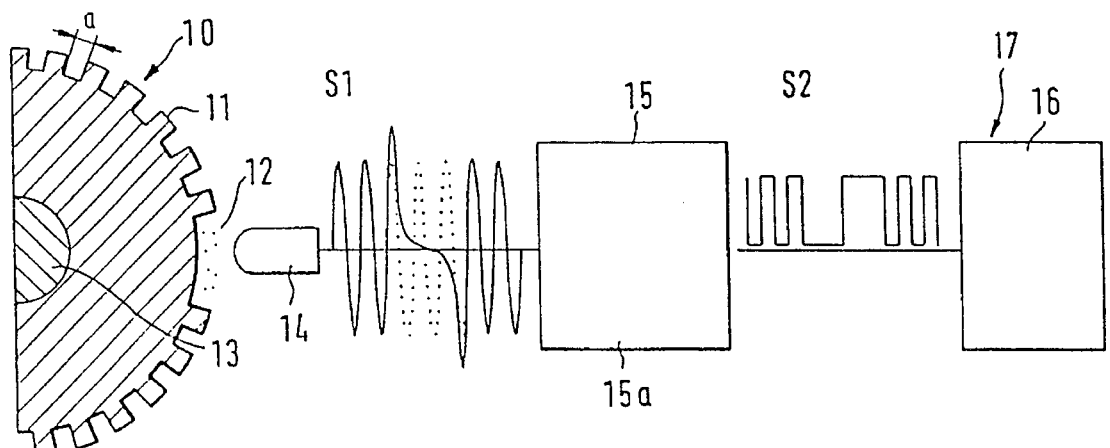
FIG. 1
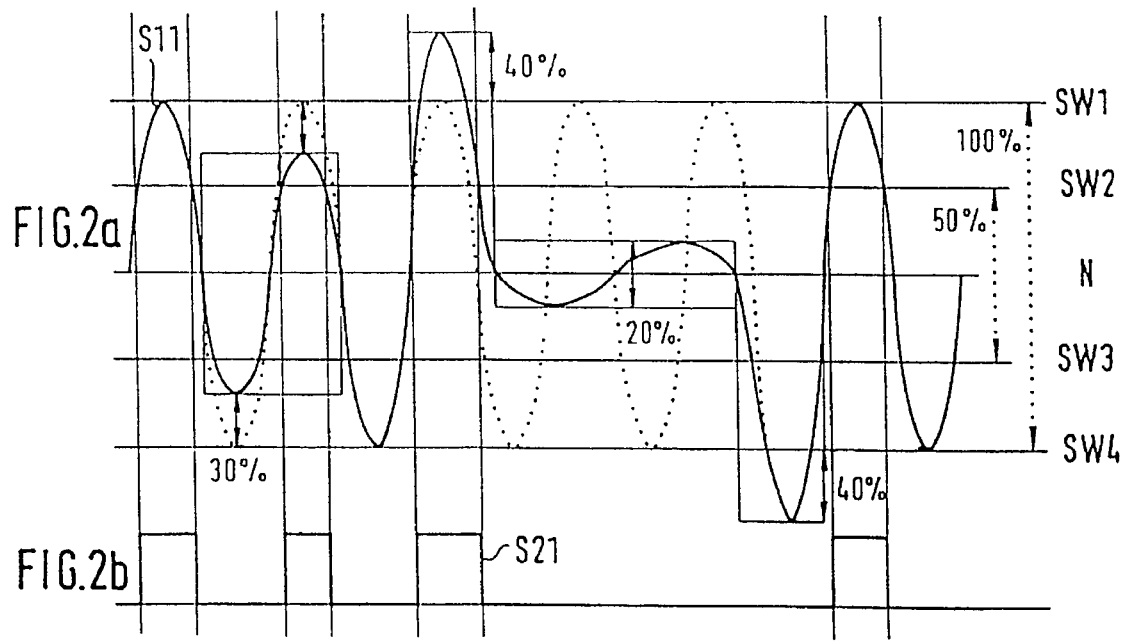

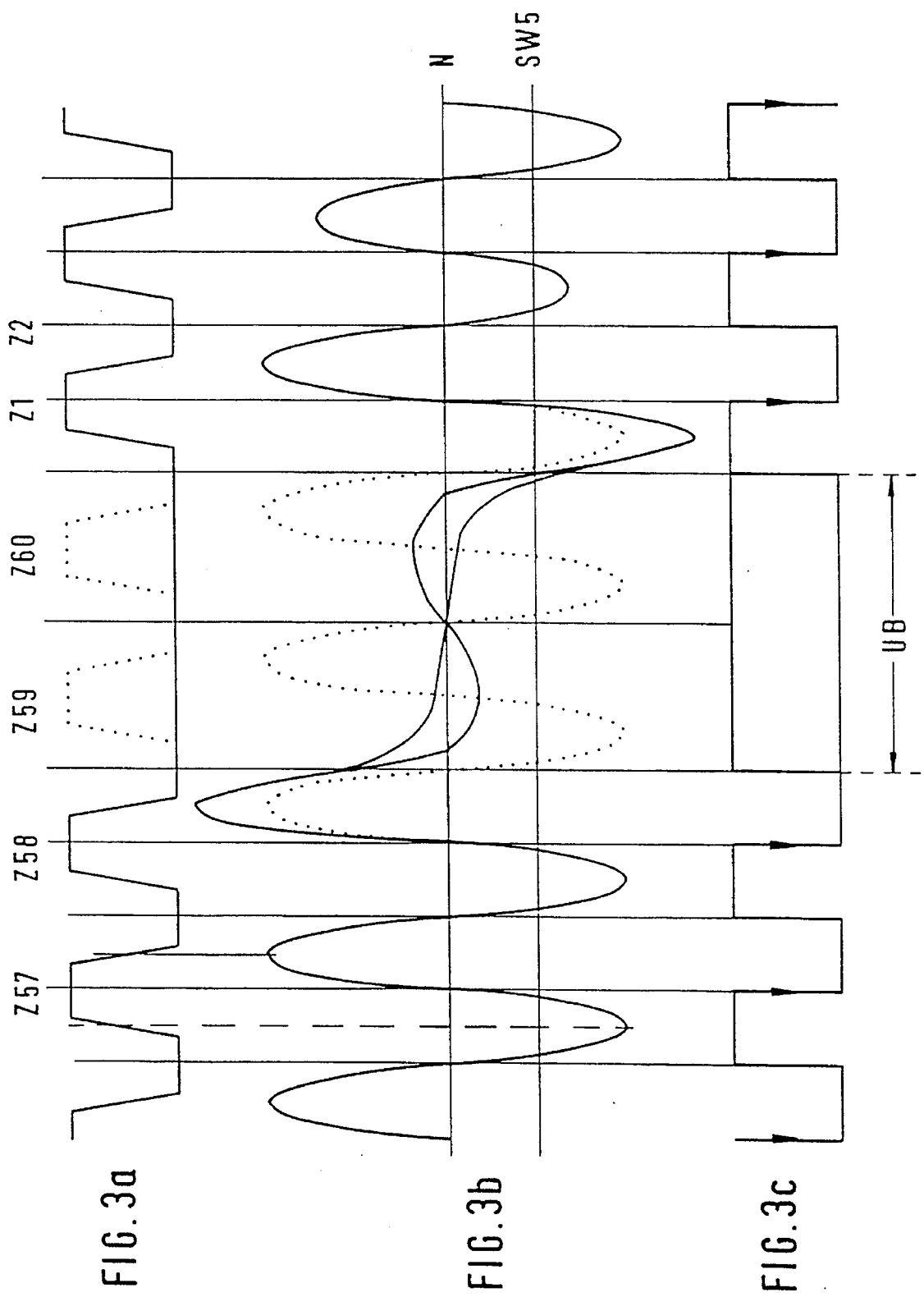

DEVICE FOR FORMING A SQUARE-WAVE SIGNAL AND DETECTING A REFERENCE MARK FROM A SINUSOIDAL SIGNAL WITH A SINGULARITY

BACKGROUND OF THE INVENTION

The invention is directed to a device for signal shaping or regeneration and for detecting reference marks, in which a square-wave signal is formed from a sinusoidal signal with a singularity and the singularity is unambiguously detected.

As is known for evaluation of a sinusoidal signal, this signal must first be transformed into a square-wave signal to simplify evaluation. Such sinusoidal signals occur, for example, as output signals of inductive sensors which sense bodies with different markings which move past these sensors.

In particular, in detecting the position of the crankshaft or camshaft of an internal combustion engine, transmitter disks which are connected with these shafts and have a number of markings are sensed by inductive sensors and the output signal obtained in so doing is evaluated in the control device of the motor vehicle. Before being evaluated, the output signal of the inductive sensor is changed into a square-wave signal. The sinusoidal signal is compared with a threshold value and a change in the flank or edge of the square-wave signal occurs when this threshold value is exceeded. Such an arrangement is known, for example, from DE-OS 31 27 220.

In this known device, it is necessary to change the threshold value as a function of the anticipated signal height, since the height of the output signal of the inductive transmitter depends extensively on the speed at which the markings pass by and a fixed threshold value would therefore cause excessive inaccuracy.

SUMMARY OF THE INVENTION

The device according to the invention for forming a square-wave signal and detecting a reference mark from a sinusoidal signal with at least one singularity characteristic of the reference mark includes means for testing whether a transition between a positive value and a negative value of the sinusoidal signal occurs at zero-axis crossing of the sinusoidal signal; means for monitoring the negative half-wave immediately following each of the zero-axis crossings to determine whether the negative half-wave is greater than or less than a predetermined threshold value; logic means for producing a level change to form a square pulse when the transition between the positive value and the negative value is detected at a zero-axis crossing and when, at the same time, the negative half-wave is greater than the predetermined threshold value immediately following the detected transition and means for measuring a time interval between the pulse edges of the square-wave signal to detect the at least one singularity and thus the reference mark.

The device according to the invention has the advantage over the prior art that the sinusoidal signal is transformed into a square-wave signal in a very accurate manner, interference is extensively suppressed, and the singularity of the sinusoidal signal caused by the reference mark is detected in a particularly reliable manner and the square-wave signal is also formed in the region of the singularity at the correct location.

This advantage is achieved in that the zero-axis crossing of the sinusoidal signal is used to form the reversing edges of the square-wave signal or to change the level and the direction of crossover of the signal is detected and checked in order to ascertain whether the sensor element is located opposite an angle mark or a gap when crossing the zero axis. In addition, the negative half-wave is monitored to determine whether or not it falls short of the threshold value.

For positive identification of the singularity of the sinusoidal signal, the distances between the switching edges are determined; the falling edge of the square-wave signal following the singularity is used for synchronization.

The circuit arrangement used in the device according to the invention has the advantage of a simple construction and can advantageously be integrated by CMOS technique and can accordingly be used according to the specific application. The linear processing of the input signal within a broad range and the extensive frequency response are likewise advantageous.

It is particularly advantageous that the external requirements between the sensor and the circuit arrangement mentioned above are reduced to a minimum so that only a protective resistor is required between the sensor and the circuit arrangement according to the invention.

Further advantages of the invention are achieved by the steps indicated in the subclaims.

BRIEF DESCRIPTION OF THE DRAWING

An embodiment example of the invention is shown in the drawing and explained more fully in the following description. In particular, FIG. 1 shows a device according to the invention. FIGS. 2a and 2b shows signal curves obtained during changes in the level of the squarewave signal when the threshold value is exceeded. FIGS. 3a, 3b and 3c signal curves obtained with the circuit arrangement according to the invention according to FIG. 4.

DESCRIPTION OF THE EMBODIMENT EXAMPLE

Figure 4:
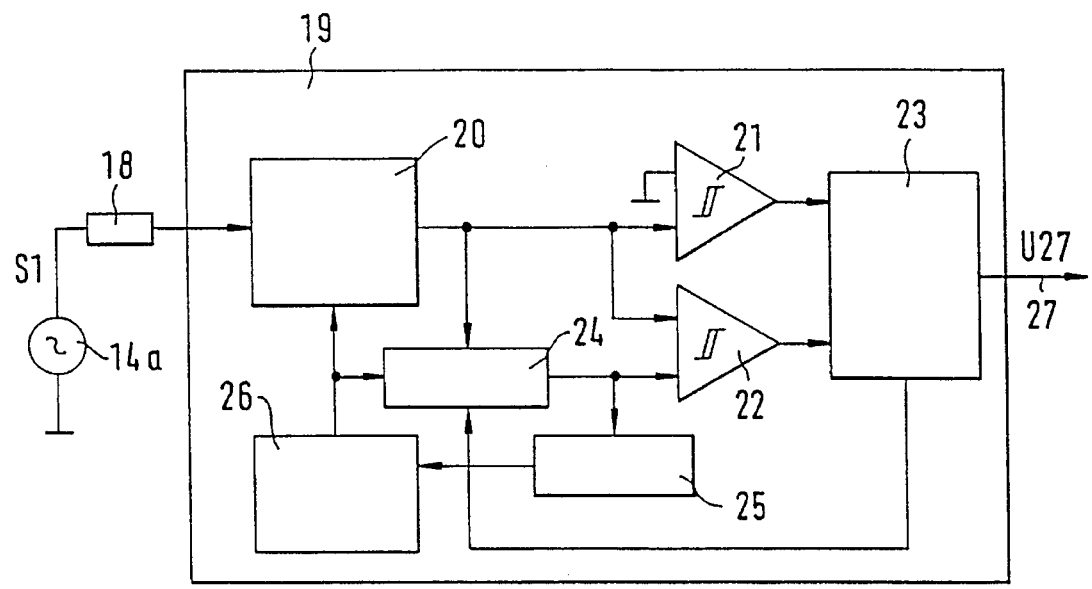

A device according to the invention with the desired signal curve is shown schematically in FIG. 1. A transmitter disk 10 has a plurality of identical angle marks 11 at its surface and a region, designated as reference mark 12, which is distinguished by two missing angle marks.

The transmitter disk 10 is rigidly connected with a rotating shaft 13, e.g. the crankshaft or camshaft of an internal combustion engine or any other rotatable shaft. The transmitter disk 10 is sensed by a receiver 14, e.g. an inductive sensor.

As the markings move past the receiver 14 the latter generates a sinusoidal output signal, designated by S1, in a known manner. This sinusoidal signal S1 fluctuates regularly about a base line or zero line and has a singularity at the point corresponding to the passage of the reference mark 12 at the receiver 14. Among other things, this singularity is characterized by a first higher pulse, two missing regular positive pulses and two missing regular negative pulses, and the occurrence of an enlarged negative pulse.

A processing circuit 15 processes the signal S1 so as to form a square-wave signal S2 with positive pulses uniquely associated with the pulses of the signal S1. The exact correspondence is shown in FIG. 3.

The square-wave signal S2, which may be viewed as a digital representation of signal S1, serves as an input signal for an angle clock 16 which is a component of a control device 17 of a motor vehicle, for instance.

The processing circuit 15 has at least one amplifier in which the sinusoidal signal is amplified in a suitable manner. This amplification is necessary because the height of the signals supplied by the receiver 14 is highly dependent on the speed of the passing marks 11 and on the rate of rotation of the shaft 13.

Further, the processing circuit 15 possesses means for aiding the detection of synchronizing gaps or reference marks 12. The output pulses of the processing circuit 15 should not be disturbed by input noise, line-related post-oscillation or by interference in the air gap.

FIG. 2 shows the type of signal curves obtained in known arrangements. The problems occurring in an evaluation circuit of this kind are also shown.

FIG. 2a shows an enlarged view of the signal curve S11 which corresponds to signal S1 and fluctuates around the zero line N. Positive and negative threshold values corresponding to 50% to 100% of the signal height are also shown. It will be seen from a close examination of the signals that all of the regular pulses have maximum values (SW1) and minimum values (SW4) of 100% and that an overshoot up to 40% higher in amplitude occurs prior to the reference mark, whereas an undershoot with an increase of up to 40% in amplitude (in terms of magnitude) occurs after the reference mark.

Modulations in the amplitudes of the preceding and subsequent pulses by up to 30% hare also possible due to the overreaching influence of the reference marks. At the appearance of the reference marks, interference which can amount to up to 20% in the example according to FIG. 2a can occur.

During the formation of the square-wave signal S21 shown in FIG. 2b, in which the edge changes are effected at 50% height (SW2, SW3) of the sinusoidal signal, the varying heights of the pulses of signal S11 according to FIG. 2a cause inaccuracies resulting in different widths of the square-wave pulses according to FIG. 2b. These different widths are prevented with the device according to the invention.

The square-wave pulses according to FIG. 2b, which have the disadvantage that the pulse-to-space ratio is not symmetrical and is heavily influenced by the modulation of the sinusoidal signal, prevent an accurate synchronization of a subsequent angle clock in which the square-wave pulses are to be evaluated. These problems are avoided with a device according to FIG. 4 and FIG. 5 whose operation will now be explained with reference to the signal curves shown in FIG. 3.

FIG. 3a shows the angle marks of a crankshaft disk already in use at the present time. These transmitter disks currently have 60–2 angle marks or teeth (Z1 to Z60). The missing angle marks 59 and 60 form the reference marks. However, the present invention is not limited to this example and can be used for any optional body with a regularly shaped surface and at least one singularity.

When a transmitter disk with an angle mark arrangement according to FIG. 3a moves past an inductive receiver, sinusoidal signals such as those shown in FIG. 3b are generated in this receiver. A crossover or zero-axis crossing (N) of the signal corresponds to the center of a mark or gap.

Overshoots occur before and after the reference mark which causes a singularity when moving past the receiver. Interference pulses can occur when the reference mark passes in front of the receiver. Definite signal changes can be defined for the signal according to FIG. 3c in that the evaluation circuit determines, during the crossover of the signal, whether the sensor is located on a tooth or on a gap between the teeth or in that the circuit arrangement detects the presence of a transition from the positive to the negative level or from the negative to the positive level.

By ascertaining for every negative half-wave whether there is actually a marker or only interference, the signal can be reshaped in a more reliable manner, which also enables a reliable detection of the reference mark. A criterion for distinguishing between a marker and interference is established by determining whether the next negative half-wave falls short of a determined threshold value, e.g. 50% of the preceding peak amplitude of the signal. If so, this is a guarantee that the receiver was located opposite an angle mark 11 during the preceding zero-axis crossover.

Since the polarity of the square-wave output pulses reverses whenever the input signal crosses the zero axis from the positive to the negative side and from the negative to the positive side, the pulse/spacing ratio is virtually identical regardless of modulation.

A transition from low to high, or from zero to one, takes place in the square-wave output signal for the duration of tile passage of the reference mark in front of the receiver, i.e. until the occurrence of regular signal pulses of the sensor output signal. Since this signal switches at the crossover of the sensor signal, the position in the reference mark gap depends upon the position of the first zero-axis crossing after the last mark appears. This zero-axis crossing depends, in turn, on the possible presence and type of interference occurring during the reference mark gap. Further, the position of the first zero-axis crossing depends upon the post-oscillation characteristic of the sensor line system.

In the system shown in FIG. 3a, the earliest crossover occurs as post-oscillation of the fifty-eighth marker (Z58) and the latest as a reaction to the immediately following marker. Within this area, there occurs a region of uncertainty UB for the next positive edge. Either a long spacing followed by a short pulse or a short spacing and a long pulse could occur. If the length of tile marks is equal to the distance between the marks, the length of tile pulses and the length of the interpulse periods are identical.

The length of the pulses and interpulse periods and the distance between selectable pulse edges can be evaluated, for example, in an angle clock connected downstream or in any time-measuring or angle-measuring instrument for detecting the reference mark gap, since the reference mark gap has a significantly greater value than the spacing between the other angle marks. Synchronization can then take place at the first falling edge of the square-wave signal according to FIG. 3c after the reference mark gap has been detected.

Figure 5:
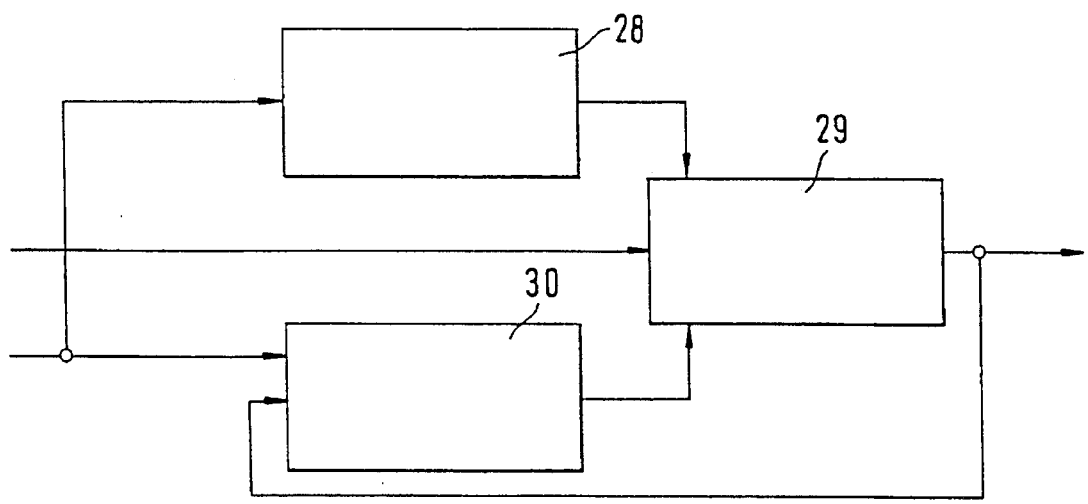
FIG. 5 shows a block diagram of the signal release logic and gap processing logic shown already in a block diagram in FIG. 4.

FIG. 4 shows a block diagram of an evaluation circuit according to the invention. The sensor element is designated by 14a and is connected, via a protective resistor 18, with the so-called internal circuit 19. This internal circuit 19 has an adjustable current/voltage transformer 20 with a half-wave rectifier 20, two comparators 21, 22, a logic 23 for releasing the signal and processing gaps, a peak-responding rectifier and storage device 24, a voltage monitoring device 25, and a gain adapter 26. The digital output signal corresponding to signal S2 in FIG. 1 occurs at output 27. The reference mark which is constructed as a gap in the embodiment example is detected in the gap processing means.

Signal S1 which is supplied by the sensor element 14a is fed to the internal circuit 19 via the protective resistor 18 in which the output voltage of the sensor which can sometimes be very high is converted into current. This current passes into the virtual mass point or ground point of an inverting operational amplifier and half-wave rectifier, the inverting operational amplifier being wired as an adjustable current/voltage transformer.

A linear representation of the negative sensor signal is formed at the output of this adjustable current/voltage transformers 20 with half-wave rectifier 20. This signal is rectified and stored in the peak-responding rectifier and storage device 24. If this signal is too large or too small, the voltage monitoring device 25 initiates a suitable adaption of the current/voltage transformer in the gain adapter 26 and the crest value stored in the peak-responding rectifier and storage device 24 is balanced.

In cooperation with the two comparators 21 and 22, the logic 23 for releasing the signal and processing the gap forms the actual core of the circuit concept according to the invention. This logic 23 is shown in more detail in FIG. 5. Block 28 represents a bidirectional or up-down counter 28, a RS flip-flop 29 and a RS flip-flop 30.

Comparator 21 indicates whether the sensor signal is positive or negative. Comparator 22 detects whether the sensor signal has reached 50% of the preceding pulse amplitude. Both pieces of information are conveyed to the logic 23 for the signal release and gap processing.

The output signal of the comparator 22 is supplied to the up-down counter 28 as well as to the RS flip-flop 30. The output signal of comparator 21, which makes it possible to detect a crossover, is supplied only to RS flip-flop 29 whose output signal is fed to a second input of the RS flip-flop 30.

With the aid of the two signals supplied by the comparators 21 and 22, the release logic carries out further processing and regeneration of the signal and reference mark gap. The up-down counter 28 enables a release of a high pulse or a logical 1. The RS flip-flop 30 causes a release of the low pulse or a logical zero. The release signals are further processed in RS flip-flop 29, the release of the logical signals 0 or 1 permits suppression of an interference pulse peak or noise.

The up-down counter 28 and the flip-flops 29, 30 can be realized by suitable computer-integrated means in the control device.

We claim:

1. A device for forming a square-wave signal (S2) and detecting a reference mark from a sinusoidal signal (S1) with at least one singularity characteristic of the reference mark, said square-wave signal comprising a plurality of square pulses having pulse edges and said sinusoidal signal (S1) comprising a plurality of positive half-waves and negative half-waves, a plurality of zero-axis crossings (N) and at least one singularity; said device including means (21) for testing whether a transition between a positive value and a negative value of the sinusoidal signal (S1) occurs at each of the zero-axis crossings (N) of the sinusoidal signal (S1); means (22) for monitoring said negative half-wave immediately following each of said zero-axis crossings (N) to determine whether said negative half-wave is greater than or less than a predetermined threshold value (SW5); logic means (23) connected ted with Said testing means and said monitoring means and producing a level change to form one of said square pulses when said transition between said positive value and said negative value is detected at one of the zero-axis crossings (N) and when, at the same time, said negative half-wave is greater than said predetermined threshold (SW5) immediately following the detected transition; and means (16) for measuring a time interval between said pulse edges of said square-wave signal (S2) to detect said at least one singularity and thus the reference mark.

2. The device as defined in claim 1, wherein said predetermined threshold value (SW5) is approximately 50% of a preceding maximum value of said sinusoidal signal (S1).

3. The device as defined in claim 1, further comprising means for producing the sinusoidal signal (S1) with said at least one singularity, said means for producing the sinusoidal signal including a rotating part having a plurality of identical marks (11) and at least one reference mark (12) distinguishable from said identical marks (11) and a magnetic sensor (14) for detecting said marks, and wherein said at least one reference mark (12) is provided by an absence of one of said at least one identical mark (11) on said rotating part and said at least one singularity in said sinusoidal signal is produced by said at least one reference mark (12).

4. The device as defined in claim 3, wherein said rotating part comprises a transmitter disk (10) and a connected shaft of an internal combustion engine.

5. The device as defined in claim 4, wherein said shaft consists of a camshaft of said internal combustion engine.

6. The device as defined in claim 4, wherein said shaft consists of a crankshaft of said internal combustion engine.

7. The device as defined in claim 4, further comprising a protective resistor (18) connecting a signal processing means (15) and said means for producing said sinusoidal signal and located before said signal processing means.

8. The device as defined in claim 1, wherein said means (21) for testing whether the transition between the positive value and the negative value of the sinusoidal signal (S1) occurs at each of the zero-axis crossings (N) of the sinusoidal signal (S1) comprises a first comparator means for determining whether said sinusoidal signal (S1) is positive or negative; said means (22) for monitoring said negative half-wave immediately following each of said zero-axis crossings (N) comprises a second comparator means for determining whether said negative half-wave reaches said predetermined threshold value, wherein said comparators are electrically connected to said logic means (23) for control of said logic means and said logic means (23) contains at least one up-down counter (28) and two RS flip-flops (29,30).

9. The device as defined in claim 2, further comprising means (24) for storing said preceding maximum value of said sinusoidal signal (S1) and wherein said means (24) for storing said preceding maximum value is connected to said means (22) for monitoring said negative half-wave.

10. The device as defined in claim 9, further comprising means (26,25) for adjusting said preceding maximum value in said means (24) for storing.

* * * * *